United States Patent [19]

Huntington

[11] Patent Number: 4,785,200
[45] Date of Patent: Nov. 15, 1988

[54] SELF CORRECTING SINGLE EVENT UPSET (SEU) HARDENED CMOS REGISTER

[75] Inventor: Robert C. Huntington, Phoenix, Ariz.

[73] Assignee: Motorola, Inc., Schaumburg, Ill.

[21] Appl. No.: 56,171

[22] Filed: Aug. 20, 1987

[51] Int. Cl.[4] .................... H03K 3/037; H03K 3/356
[52] U.S. Cl. ............................ 307/279; 307/296 R; 377/30; 377/79
[58] Field of Search ................. 307/279, 296.4, 966.5; 377/115, 116, 117, 104, 77, 79, 30

[56] References Cited

U.S. PATENT DOCUMENTS

| | | | |
|---|---|---|---|
| 4,199,810 | 4/1980 | Gunckel, II et al. | 364/200 |
| 4,394,769 | 7/1983 | Lull | 307/446 |
| 4,399,377 | 8/1983 | Jones | 307/289 |

Primary Examiner—John S. Heyman
Attorney, Agent, or Firm—Michael D. Bingham

[57] ABSTRACT

A self correcting single event upset-hardened CMOS register comprises a master portion and a slave portion. The master portion is coupled to a source of data and includes a feedback means such that said master portion can store said data during the first phase of a bi-phase clock signal. A slave portion including a second feedback path, has an input coupled to the output of said master portion and has an output which comprises the output of the register. An odd plurality of inverters is placed in series in the feedback path so as to isolate each node which is a possible site for high-energy particle impingement from other nodes in the loop and to attenuate and delay any resulting impulses such that the state of the error pulse cannot be maintained thus permitting the slave loop to remain in the state determined by the preceding data pulse.

7 Claims, 3 Drawing Sheets

SELF CORRECTING SINGLE EVENT UPSET (SEU) HARDENED CMOS REGISTER

BACKGROUND OF THE INVENTION

This invention relates generally to CMOS register circuits and, more particularly, to a self-correcting SEU-hardened CMOS register.

A standard D-type CMOS register of the type which is well known in the prior art consists of an input master loop and an output slave loop. Input data is locked into the master loop on a first transition (e.g. rising edge) of a clock pulse. On the next clock pulse transition (e.g. falling edge), the data previously stored in the master loop is locked into the slave loop, and the master loop is isloated from the circuit's output. During this time period (e.g. when the clock is held low for an extended period of time), SEU (Single Event Upset) -hardness is of extreme concern.

As is well known, the earth is constantly being bombarded with very high energy particles; the worst case situation occurring upon the impingement of a 150-MeV Krypton ion which produces a worst case charge of four pico coulombs which decays exponentially with a time constant of 250 picoseconds. Such particles can generate very high negative instantaneous currents when striking a CMOS device which may result in the grounding of a junction. It should be apparant that if any one of the nodes in the slave loop of a CMOS register is momentarily grounded by such a particle during the period of time when the clock is low, the state of the loop may be forced into compliance with a logic state of zero at that node. This in turn may result in a register output which is incorrect. This can be extremely disadvantageous if, for example, the registers are programmed to define a particular mode of operation which remains defined for long periods of time, perhaps even months. One known CMOS register circuit which was designed to solve this problem utilizes triple redundancy and voting logic. The circuit incorporates three parallel registers, each of which has a voting circuit in its slave loop feedback. The outputs of all three slave loops are coupled into all three voting circuits such that the loop feedback for each of the three loops is that for which at least two of the loops are in agreement. Thus, if a SEU-induced error occurs in one of the slave loop circuits, its voting logic will override the error and drive the loop back into conformance with the other two loops. It should be apparent, that this approach results in a circuit which is bulky, includes a large number of devices, occupies a relatively large chip area, and presents three times the input load capacitance when compared to a nonredundant register.

In yet another attempt at providing a circuit which is immune to single event upsets caused by incident high energy cosmic particles, hardening resistors have been employed in the propagation path. Unfortunately, this renders the circuitry less useful for high speed applications.

SUMMARY OF THE INVENTION

It is an object of the present invention to provide an improved SEU-hardened CMOS register.

It is a further object of the present invention to provide an SEU-hardened CMOS register which is simple to construct, occupies little area on a die, and minimizes input capacitance.

It is a still further object of the present invention to provide a self correcting SEU hardened CMOS register which is suitable for high speed applications.

According to a broad aspect of the invention there is provided an improved CMOS register of the type wherein there is provided a master portion including a first feedback path, which master portion stores data during the first phase of a bi-phase clock signal, and a slave portion having an output and having an input coupled to the master portion including a second feedback path for storing the data during a second phase of the bi-phase clock signal. The master portion is isolated from said slave portion during said second phase. The improvement comprises a plurality of attenuation and delay means coupled in series in the second feedback path.

The above and other objects, features and advantages of the present invention will be more clearly understood from the following detailed description taken in conjunction with the accompanying drawings, in which:

DESCRIPTION OF THE PREFERRED EMBODIMENT

Figure 1A:
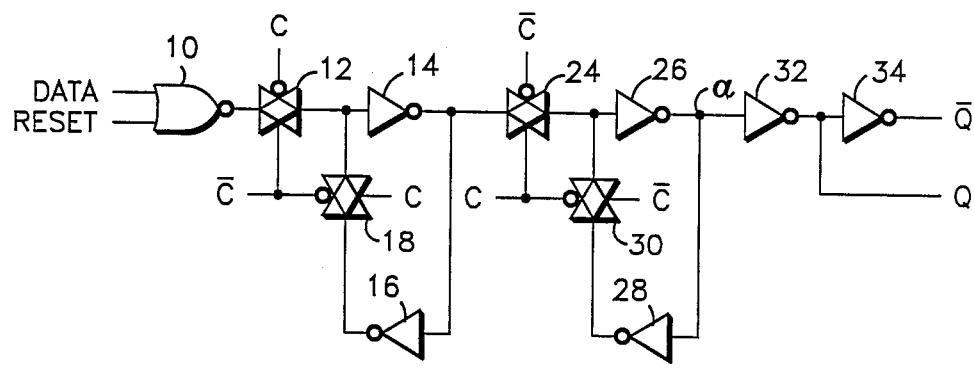
FIG. 1A is a logic diagram of a standard D-type CMOS register.

FIG. 1A is a logic diagram illustrating a standard D-type CMOS register. DATA in the form of a logical 1 or a logical 0 is applied to a first input of NOR gate 10. The second input of NOR gate 10 is adapted to receive a reset signal. The master loop of the CMOS register shown in FIG. 1A comprises inverter 14, inverter 16, and transmission gate 18. As can be seen, transmission gate 12 is coupled between the output of NOR gate 10 and the input of inverter 14 which in turn has an output coupled to the input of inverter 16. Transmission gate 18 is coupled between the output of inverter 16 and the input of inverter 14.

Figure 1B:
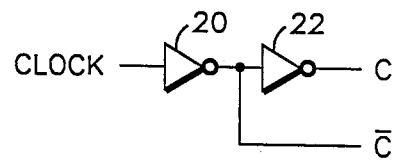
FIG. 1B is a logic diagram of a circuit for generating the clock signal used in the circuit of FIG. 1A.

Signals C and $\overline{C}$ represent opposite phases of a bi-phase clock signal generated as is shown in FIG. 1B. That is, a master CLOCK is applied to an input of inverter 20 having an output which forms CLOCK signal C and, after inversion in inverter 22, forms a CLOCK signal C.

Transmission gate 12, comprised of a P-channel MOSFET and an N-channel MOSFET in accordance with known techniques, is stuctured so as to conduct when C is low and $\overline{C}$ is high. Thus, at this time the data appears at the input of inverter 14. In this case, however, transmission gate 18 is nonconducting and therefore there is no feedback from the output of inverter 14. It should be noted also that at this time transmission gate 24 is also nonconducting.

On the rising edge of clock signal C (C goes high and $\overline{C}$ goes low), transmission gate 12 is rendered nonconductive, and transmission gate 18 is rendered conductive. Thus, the data appearing at the output of inverter 14 is fed back to the input of inverter 14 via inverter 16 and transmission gate 18.

The slave loop portion of the circuit comprises transmission gate 24, inverter 26, inverter 28 and transmission gate 30. When C goes high and $\overline{C}$ goes low, the data is locked into the master loop as described above. Also, transmission gate 24 is rendered conductive permitting data to pass through inverter 26. However, since transmission gate 30 is nonconductive, there is no feedback in the slave loop.

When C goes low ($\overline{C}$ goes high), transmission gate 24 is rendered nonconductive and transmission gate 30 is rendered conductive allowing the output of the inverter 26 to be fed back to its input. Transmission gate 24 is rendered nonconductive, and the data is locked into the slave loop which is now isolated from the master loop.

The output of the slave loop passes through inverter 32 to form the Q output of the register and, after further inversion in inverter 34, forms a $\overline{Q}$ output of the register.

It is during the time that C is low that SEU-hardness is of concern. That is, if any one of the circuit nodes in the slave loop is momentarily grounded by an incident cosmic particle during this period of time, the state of the loop will be forced into compliance with the logic state of zero at that node possibly resulting in an incorrect output state for the register. For example, if the data requires that the output of inverter 26 be a logical high, a particle striking node A will cause a zero to appear at the input of inverter 28, a logical one or a high to appear at the output of inverter 28 and, because transmission gate 30 is conducting, the logical high will be applied to the input of inverter 26 thus locking the output of the slave loop at an incorrect logical low or zero state.

Figure 2:
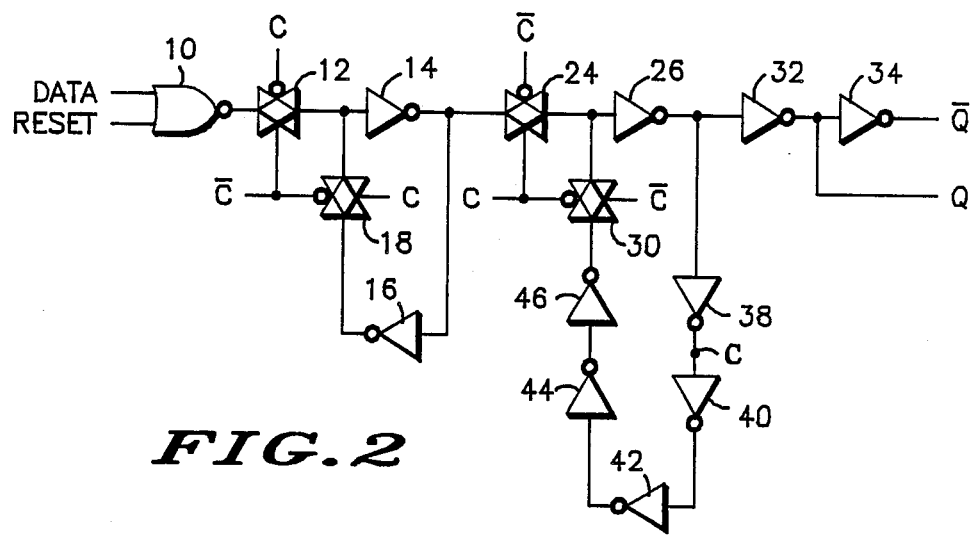
FIG. 2 is a logic diagram of the inventive self-correcting SEU-hardened CMOS register.

FIG. 2 is a logic diagram of a self correcting SEU hardened CMOS register in accordance with the present invention. The master/slave loop relationship is the same as that for the preceding circuit and therefore will not be described again. The slave loop, however, differs in that there are plurality of attenuation and delay means (in this case an odd number of inverters 38, 40, 42, 44, and 46) in the slave feedback loop. Each of these inverters is designed to have a gain-bandwidth product less than unity at frequencies present in the SEU pulse which may be accomplished in the well known manner by altering the width-to-length ratios of the device channel (in the case of an MOS device). It should be noted, however, that only the feedback inverters 38, 40, 42 and 44 and 46 are required to have reduced gain bandwidth for SEU stability. The series inverter 26 in the signal path may have a very high gain bandwidth to avoid degradation of data propagation speed.

Figure 3A:
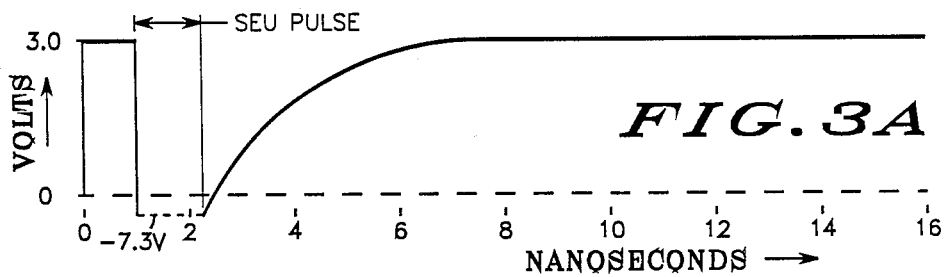
FIGS. 3A-F illustrate the propagation of a single event upset through the master loop of the inventive SEU hardened CMOS register shown in FIG. 1.
Figure 3B:
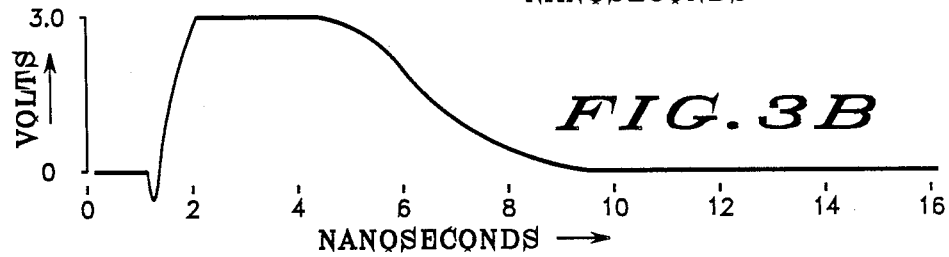
Figure 3C:
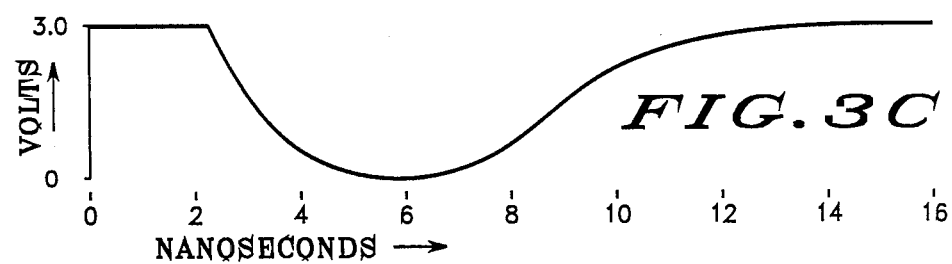
Figure 3D:
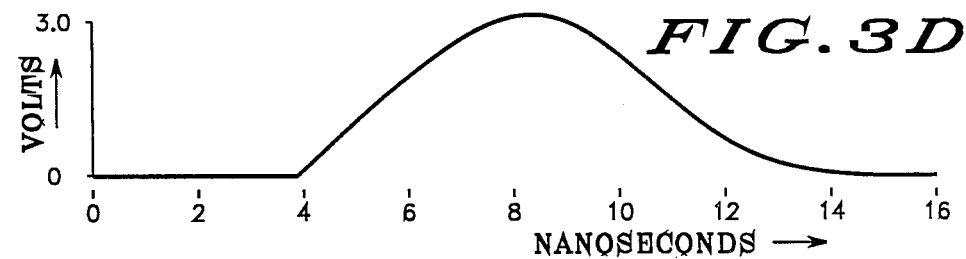
Figure 3E:
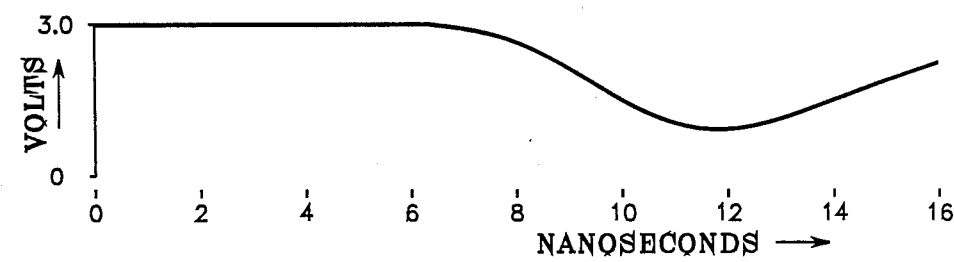
Figure 3F:
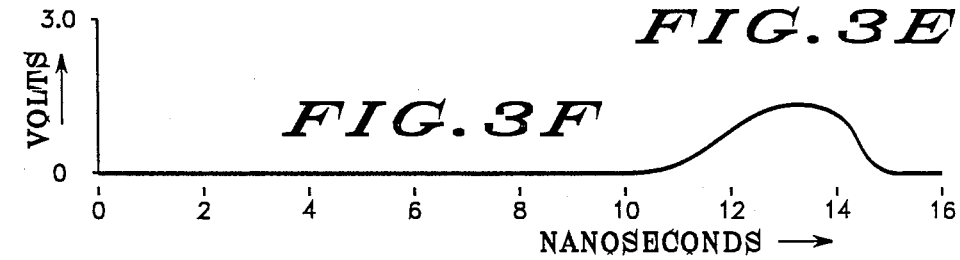

The function of the plurality (5 in FIG. 2) of inverters in the feedback loop is to isolate each circuit node by several other slow inverters such that by the time an SEU impulse is propagated around the feedback loop, it has been so heavily attenuated and delayed that the state of the error impulse cannot be maintained. In this manner the slave loop remains in the state determined by the preceding data pulse. This may be illustrated with the help of FIGS. 3A–F. Assume first that the output of inverter 26 is a logical low. Thus, the output of the circuit Q will be a logical high and $\overline{Q}$ will be a logical low. The output of the inverter 38 in the feedback loop will be a logical high since a logical low is being applied to its input. If we assume that a cosmic particle of the type described above strikes node C, the potential at node C will be almost instantaneously driven to a negative voltage (e.g. −7.3 volts) as shown in FIG. 3A. As can be seen, the SEU pulse at node C lasts for approximately 0.7 nanoseconds. This pulse will be propagated through the feedback loop. FIGS. 3B–3F illustrate the appearance of the propagated effect of the SEU pulse at the outputs of inverters 40, 42, 44, 46, and 26 respectively. As can be seen, in each case it is somewhat delayed and attenuated. Referring to FIG. 3F which illustrates the pulse at the output of inverter 26, it can be seen that it is only approximately 5 nanoseconds long with a peak amplitude of approximately 1½ volts which normally would be below the threshold of the following inverter. In any event, this degradation of pulse propagation around the loop will continue until the threshold voltage of a following inverter is not reached, at which point propagation ceases. Thus, the loop remains locked in its correct state.

Thus, there has been provided a self-correcting SEU-hardened CMOS register which is simple, inexpensive, occupies little die area, has no more input capacitance than a non-hardened register, and does not present undue increased propagation delay in the data propagation path.

The above description is given by way of example only. Changes in form and details may be made by one skilled in the art without departing from the scope of the invention as defined by the appended claims.

I claim:

1. An improved register of the type wherein there is provided a master portion including a first feedback path, which master portion stores data during the first phase of a bi-phase clock signal, and a slave portion having an output and having an input coupled to said master portion including a second feedback path for storing said data during a second phase of said bi-phase clock signal, said slave portion including a series inverter and said second feedback path extending from the output of said series inverter to the input of series inverter, said master portion being isolated from said slave portion during said second phase, the improvement commprising:
   a plurality of attenuation and delay means coupled in series in said second feedback path, said plurality of attenuation and the delay means comprising an odd plurality of series coupled inverters.

2. An improved register according to claim 1 wherein said series inverter has a gain bandwidth product which is high compared to that of each of said odd plurality of inverters.

3. An improved CMOS register according to claim 2 wherein said odd plurality of inverters comprises five inverters.

4. An improved register according to claim 1 wherein said register is a CMOS register.

5. A CMOS register, comprising:
   a master portion having an input coupled to a source of data and having an output, said master portion for storing said data;
   a slave portion having an input coupled to the output of said master portion and having an output, said slave portion including propagation means and feedback means, said feedback means coupled between the output of said propagation means and the input of said propagation means; and
   a plurality of attenuation and delay means coupled in series in said feedback means, said plurality of attenuation and delay means comprising an odd plurality of inverters.

6. A register according to claim 5 wherein said propagation means comprises a propagation inverter.

7. A register according to claim 5 wherein said propagation inverter has a gain bandwidth product which is high compared to that of each of said odd plurality of inverters.

* * * * *